(12) United States Patent
La Rosa et al.

(10) Patent No.: US 10,971,633 B2
(45) Date of Patent: Apr. 6, 2021

(54) STRUCTURE AND METHOD OF FORMING A SEMICONDUCTOR DEVICE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 6 days.

(21) Appl. No.: 16/560,810

(22) Filed: Sep. 4, 2019

(65) Prior Publication Data
US 2021/0066510 A1 Mar. 4, 2021

(51) Int. Cl.
| | |
|---|---|
| *H01L 29/861* | (2006.01) |
| *H01L 27/07* | (2006.01) |
| *H01L 29/788* | (2006.01) |
| *H01L 29/66* | (2006.01) |

(52) U.S. Cl.
CPC ...... *H01L 29/8611* (2013.01); *H01L 27/0727* (2013.01); *H01L 29/66136* (2013.01); *H01L 29/66825* (2013.01); *H01L 29/788* (2013.01)

(58) Field of Classification Search
CPC ............. H01L 27/0727; H01L 29/8611; H01L 29/66136; H01L 29/66825; H01L 29/788
USPC ........................................................ 257/551
See application file for complete search history.

(56) References Cited

U.S. PATENT DOCUMENTS

| | | | |
|---|---|---|---|
| 6,180,996 B1 | 1/2001 | Onoda et al. | |
| 6,437,609 B1 | 8/2002 | Chehadi | |
| 2001/0046158 A1 | 11/2001 | Ishige | |
| 2007/0267700 A1 | 11/2007 | Russ et al. | |
| 2010/0230751 A1* | 9/2010 | Botula | H01L 21/26586 257/347 |
| 2010/0237421 A1* | 9/2010 | Chou | H01L 29/66356 257/368 |
| 2012/0326157 A1* | 12/2012 | Park | H01L 29/66757 257/72 |

(Continued)

FOREIGN PATENT DOCUMENTS

| | | |
|---|---|---|
| EP | 0923132 A1 | 6/1999 |
| EP | 1094604 A1 | 4/2001 |

*Primary Examiner* — Igwe U Anya
(74) *Attorney, Agent, or Firm* — Slater Matsil, LLP

(57) ABSTRACT

In accordance with an embodiment of the present invention, a method of making a semiconductor device includes simultaneously etching a semiconductor layer and a conductive layer to form a self-aligned diode region disposed on an insulating layer, where the semiconductor layer has a first conductivity type. The method further includes etching through first openings of a mask layer to form first implantation surfaces on the semiconductor layer and to form a plurality of projecting regions including conductive material of the conductive layer over the semiconductor layer. The method further includes using the plurality of projecting regions as a part of a first implantation mask, performing a first implantation of dopants having a second conductivity type into the semiconductor layer, to form a sequence of PN junctions forming diodes in the semiconductor layer. The diodes vertically extend from an upper surface of the semiconductor layer to the insulating layer.

20 Claims, 13 Drawing Sheets

(56) References Cited

U.S. PATENT DOCUMENTS

| | | | |
|---|---|---|---|
| 2013/0168779 A1* | 7/2013 | Chao | H01L 21/3215 257/402 |
| 2013/0328124 A1* | 12/2013 | Chou | H01L 29/7391 257/351 |
| 2016/0172356 A1 | 6/2016 | Cheng et al. | |
| 2017/0345836 A1* | 11/2017 | La Rosa | H01L 29/7394 |
| 2019/0067309 A1 | 2/2019 | La Rosa et al. | |

\* cited by examiner

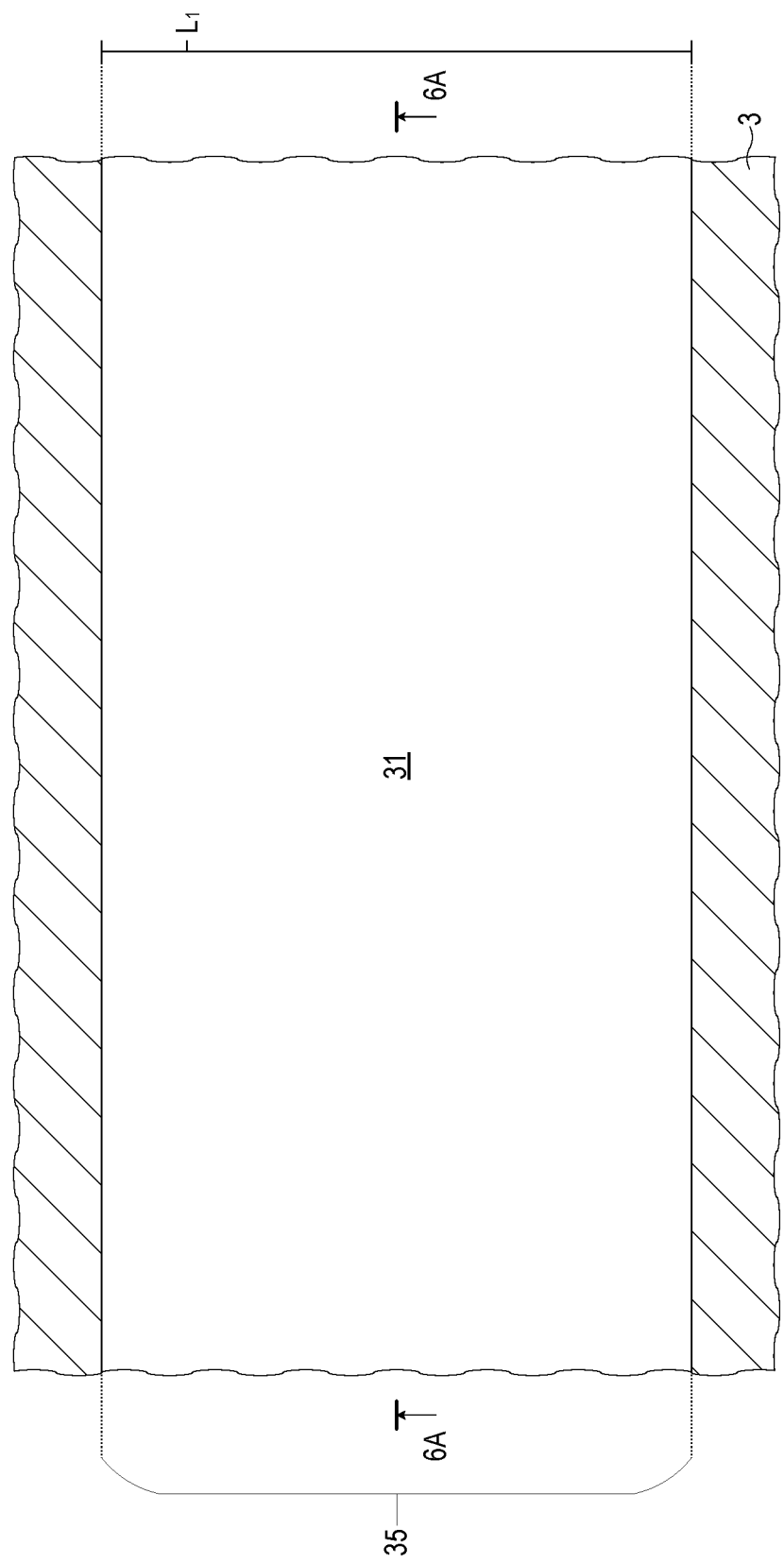

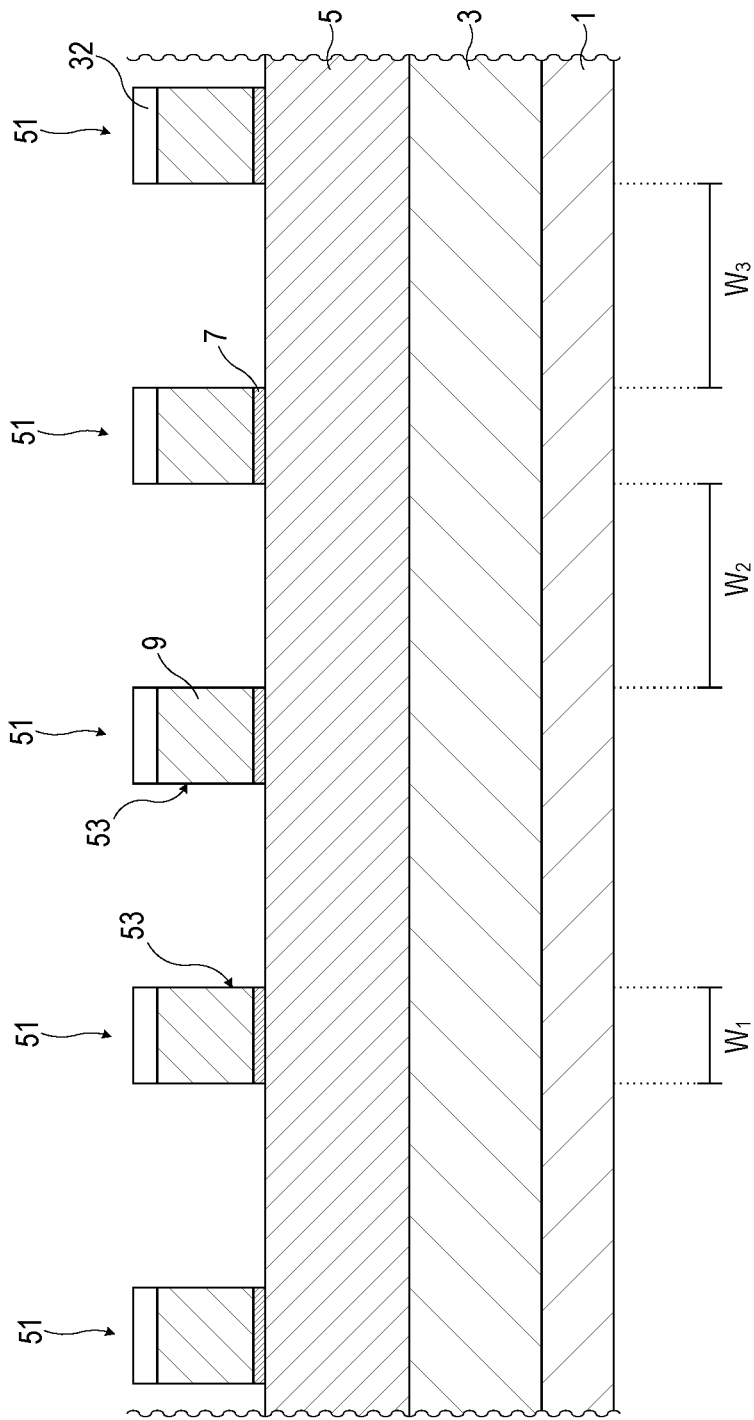

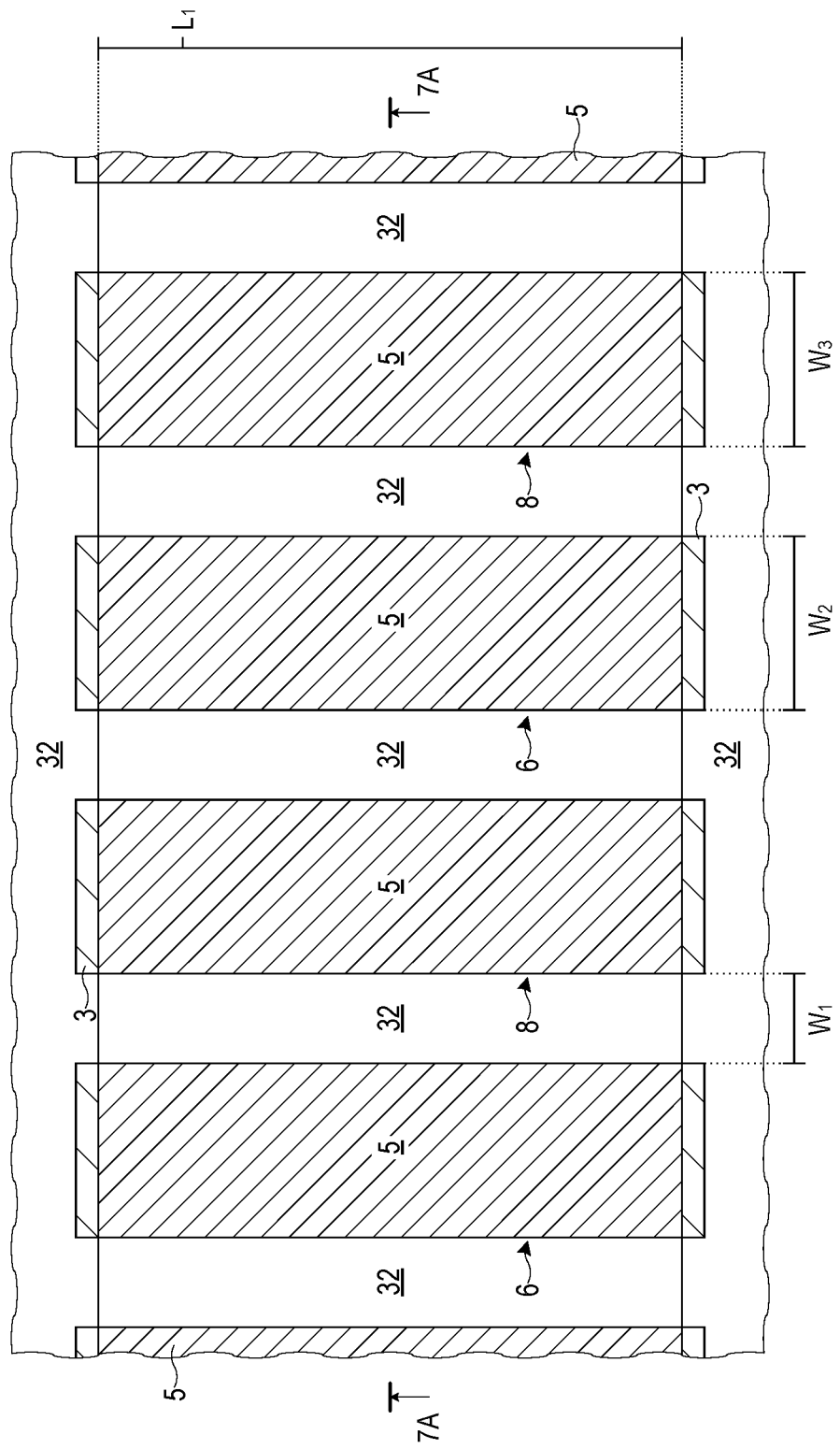

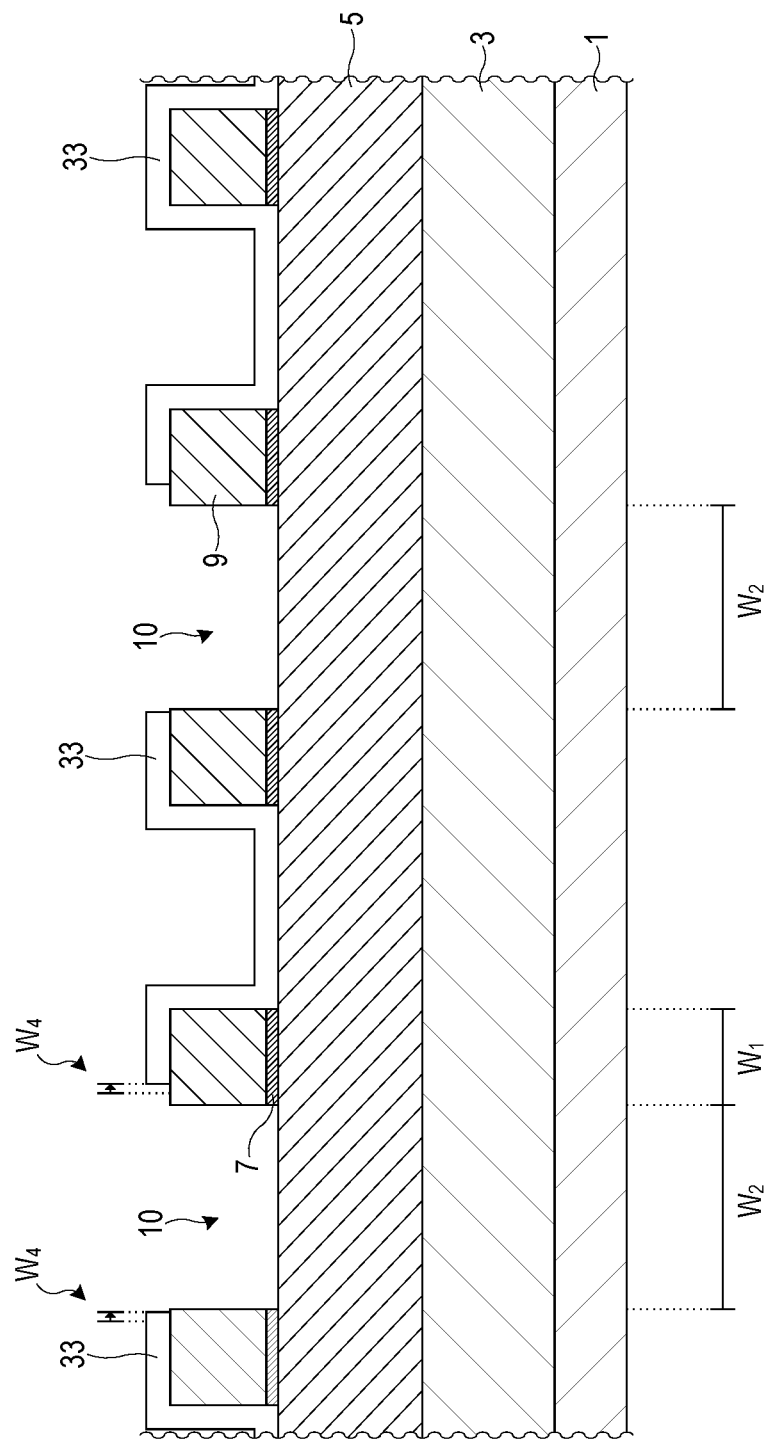

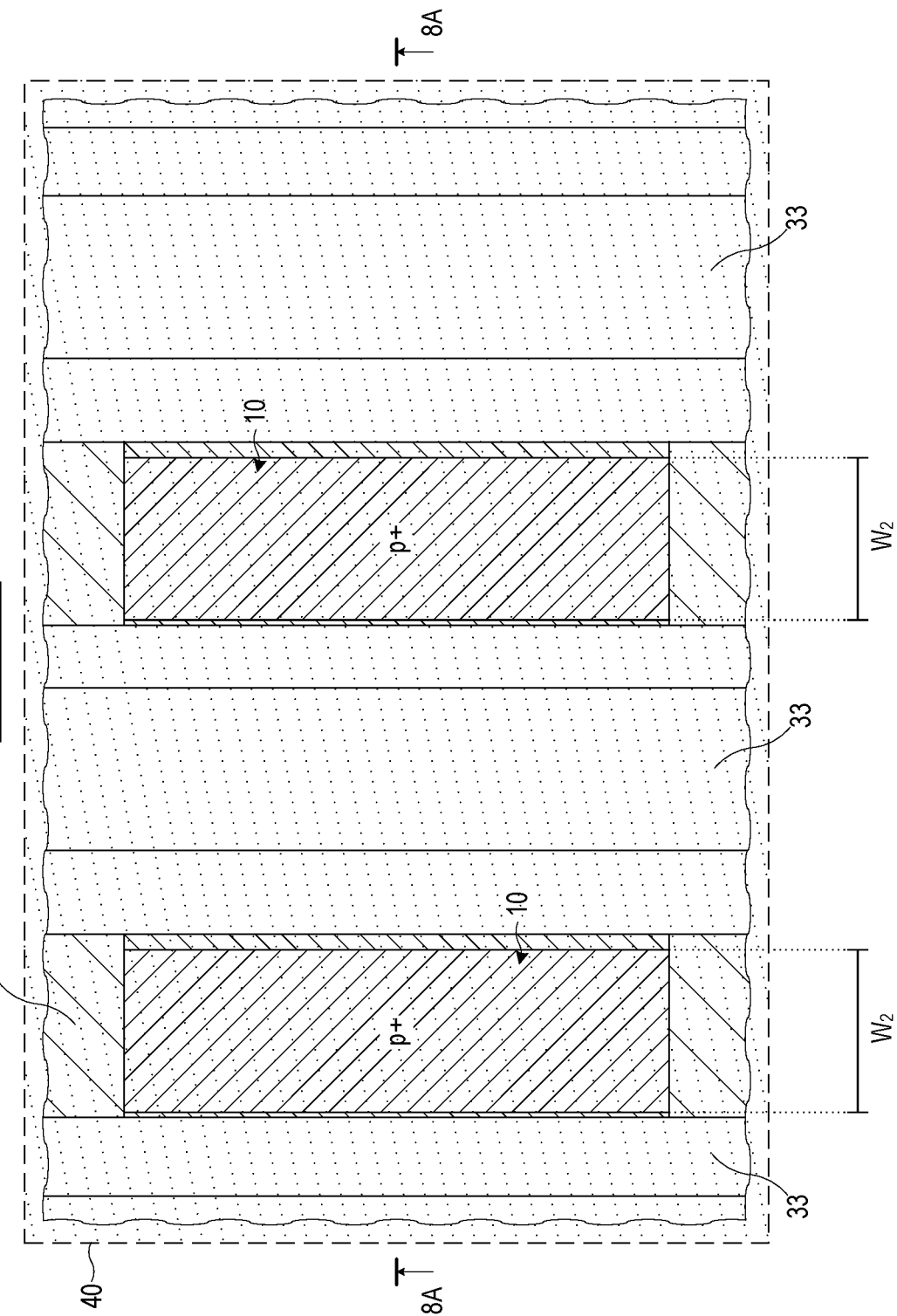

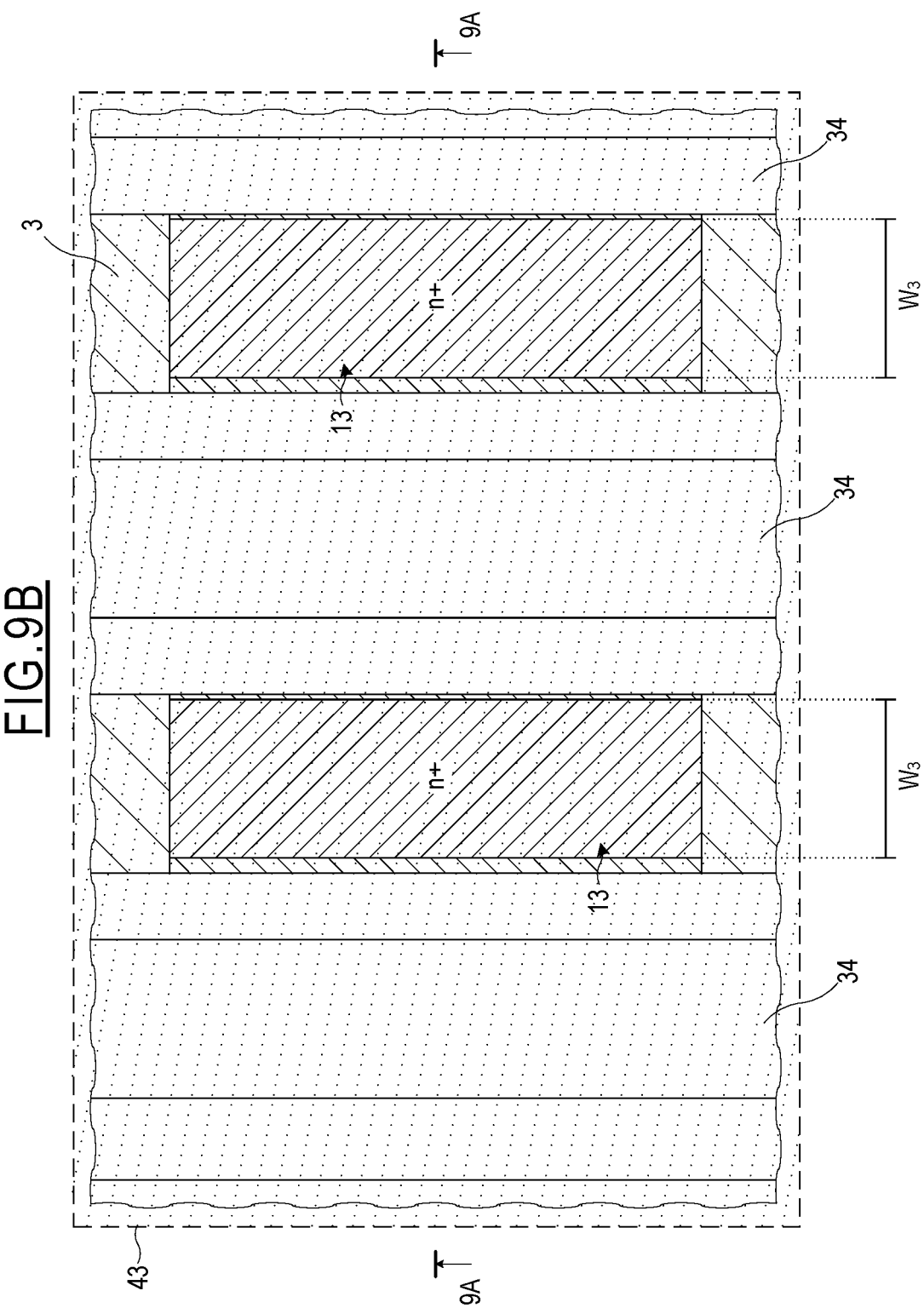

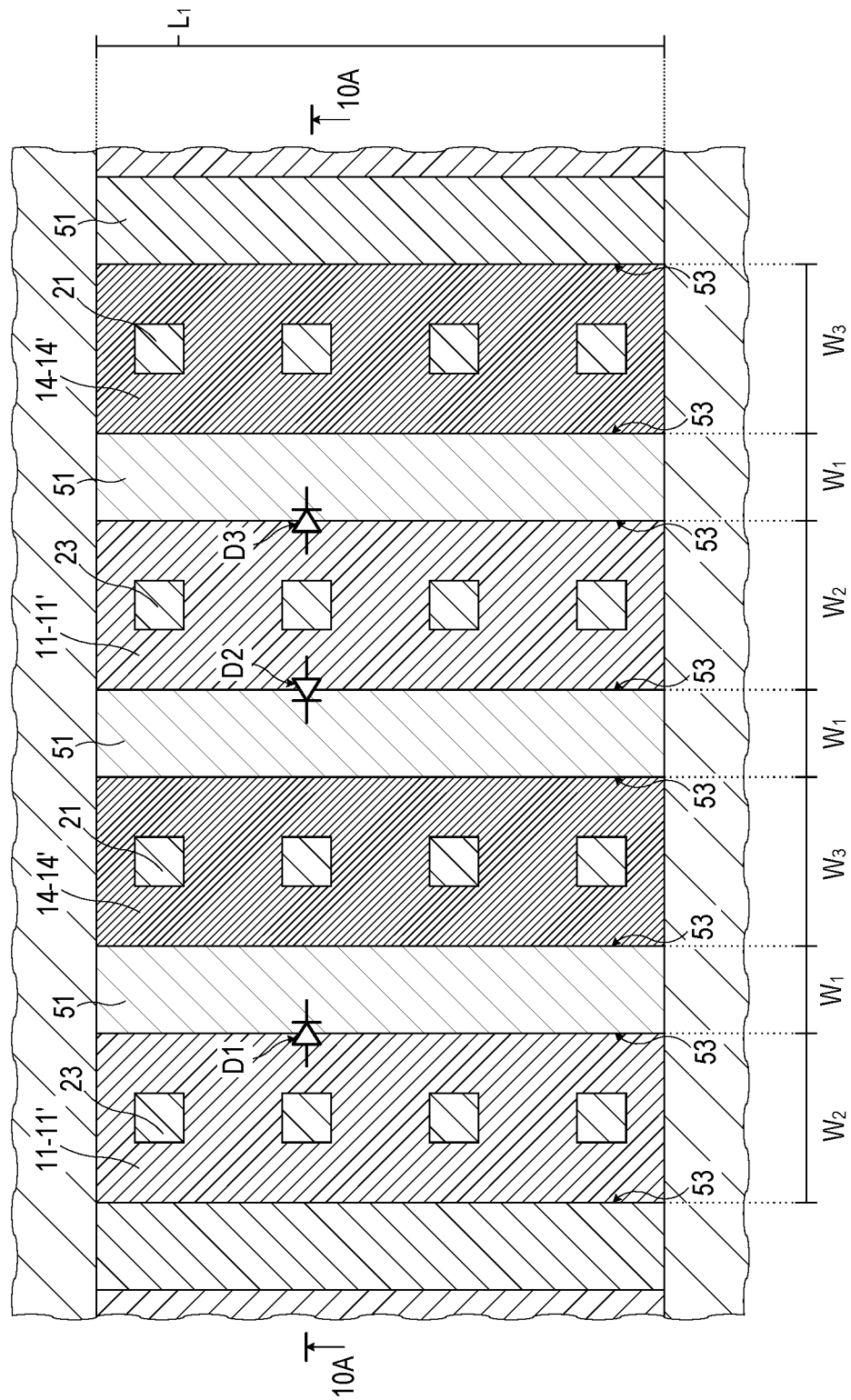

STRUCTURE AND METHOD OF FORMING A SEMICONDUCTOR DEVICE

TECHNICAL FIELD

The present invention relates generally to semiconductor devices, and, in particular embodiments, to structures and methods of forming semiconductor devices with PN junctions.

BACKGROUND

Semiconductor devices may include a variety of active and passive devices integrated on a semiconductor substrate. One type of passive device is a diode. Diodes include a PN junction and are used in many semiconductor applications. Diodes can be fabricated simultaneously with other components such as transistors, capacitors, resistors, and the like.

Diodes may be directly implanted in the semiconductor substrate. A diode that is directly implanted in the semiconductor substrate can include parasitic PN junctions which can impact behavior of a circuit including the diode. For example, effects due to parasitic PN junctions may be seen during starting and/or latching of a circuit. On the other hand, dopant diffusion processes may also be used to fabricate diodes. However, masks used for dopant diffusion can require strict alignment which can be difficult to establish. Defects due to variations in alignments accuracy can result in unpredictability of the characteristics of the diodes.

The compatibility of diode fabrication process flows with other process flows such as complimentary metal-oxide-semiconductor (CMOS) process flows, capacitor process flows, non-volatile memory (NVM) process flows, and others may be desirable in order to reduce complexity and cost and/or increase throughput. Additionally, it may also be desirable to decrease or eliminate the presence of parasitic PN junctions and improve alignment accuracy so that the predictability and performance of fabricated diodes may be improved.

SUMMARY

In accordance with an embodiment of the present invention, a method of making a semiconductor device includes simultaneously etching a semiconductor layer and a conductive layer to form a self-aligned diode region disposed on an insulating layer, where the semiconductor layer has a first conductivity type. The method further includes etching through first openings of a mask layer to form first implantation surfaces on the semiconductor layer and to form a plurality of projecting regions comprising conductive material of the conductive layer over the semiconductor layer. The method further includes using the plurality of projecting regions as a part of a first implantation mask, performing a first implantation of dopants having a second conductivity type into the semiconductor layer, to form a sequence of PN junctions forming diodes in the semiconductor layer, the diodes vertically extending from an upper surface of the semiconductor layer to the insulating layer.

In accordance with an embodiment of the present invention, a method of making an integrated circuit includes forming an insulating layer over a surface of a semiconductor substrate, the insulating layer comprising an active region at a first location of the semiconductor substrate; forming a semiconductor layer having a first conductivity type and overlying the insulating layer; forming a gate dielectric layer over the semiconductor layer; forming a conductive layer over the gate dielectric layer; simultaneously patterning the semiconductor layer, the gate dielectric layer, where the conductive layer to form a self-aligned diode region on the insulating layer at a second location of the semiconductor substrate. The method further includes patterning the conductive layer to form a control gate overlying the floating gate at the first location and to form projecting regions overlying the semiconductor layer at the second location; and using the plurality of projecting regions as a hard mask, implanting dopants of a second conductivity type into first areas of the semiconductor layer so that interleaved regions beneath the plurality of projecting regions remain doped with the first conductivity type to forma a sequence of PN junctions forming diodes in the semiconductor layer, where the diodes vertically extends from an upper surface of the semiconductor layer to the insulating layer.

An integrated circuit includes a semiconductor substrate; an insulating layer overlying the semiconductor substrate; a semiconductor layer of a first conductivity type overlying the insulating layer, the semiconductor layer comprising a longitudinal length; a plurality of projecting regions that are spaced apart from each other overlying the semiconductor layer. Each of the plurality of projecting regions comprises a longitudinal length equal to the longitudinal length of the semiconductor layer. The integrated circuit further includes a sequence of PN junctions in the semiconductor layer, where each PN junction is located at an edge of an associated projecting region and vertically extending from an upper surface of the semiconductor layer to the insulating layer.

BRIEF DESCRIPTION OF THE DRAWINGS

Other advantages and characteristics of the invention will be apparent from a perusal of modes of construction and embodiment of the invention, which are not limiting in any way, and the appended drawings, in which:

FIGS. 6A and 6B illustrate the semiconductor device during fabrication and after etching the stack in accordance with an embodiment of the invention, wherein FIG. 6A illustrates a cross sectional view of the semiconductor device and FIG. 6B illustrates a top view of the semiconductor device;

FIGS. 7A and 7B illustrate the semiconductor device during fabrication and after etching the conductive layer and the dielectric layer to form projecting regions in accordance with an embodiment of the invention, wherein FIG. 7A illustrates a cross sectional view of the semiconductor device and FIG. 7B illustrates a top view of the semiconductor device;

FIGS. 8A and 8B illustrate the semiconductor device during fabrication and after forming a first implant mask layer in accordance with an embodiment of the invention, wherein FIG. 8A illustrates a cross-sectional view of the semiconductor device and FIG. 8B illustrates a top view of the semiconductor device;

FIGS. 9A and 9B illustrate the semiconductor device during fabrication and after forming a second implant mask layer in accordance with an embodiment of the invention, wherein FIG. 9A illustrates a cross-sectional view of the semiconductor device and FIG. 9B illustrates a top view of the semiconductor device; and FIGS. 10A and 10B illustrate an example semiconductor device in accordance with an embodiment of the invention, wherein FIG. 10A shows a cross-sectional view of the semiconductor device and FIG. 10B shows a top view of the semiconductor device.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The inventors have discovered that recurrent problems are encountered in the use of diodes whose doped regions are directly implanted in a semiconductor substrate. These undesirable effects may be, for example, due to parasitic PN junctions, and may strongly affect the starting or latching of the circuit. It may be then desirable to avoid these parasitic effects in a way that is both simple and compatible with other process flows (e.g. NVM technology). Such compatibility may be in contrast to, for example, a capacitor process flow which may have additional masking steps in order to provide contact to an additional layer.

The inventors have also discovered that some dopant diffusion processes in conventional diode manufacturing methods are poorly controlled. For example, masks used during dopant diffusion processes may have limited alignment accuracy. The alignment shortcomings of the masks may result in defects that cause unpredictability of the characteristics of the diodes. Therefore, it may also be desirable to reduce the alignment requirements for masks used in doping processes while still maintaining process flow compatibility.

Modes of construction and embodiments of the invention relate to PN junction diodes, and, in some embodiments, to polycrystalline silicon-based diodes used, for example, to form a bridge rectifier (Graetz bridge) in integrated circuits for use, for example, in contactless telecommunications technologies and incorporating, for example, non-volatile memories.

Figure 1:
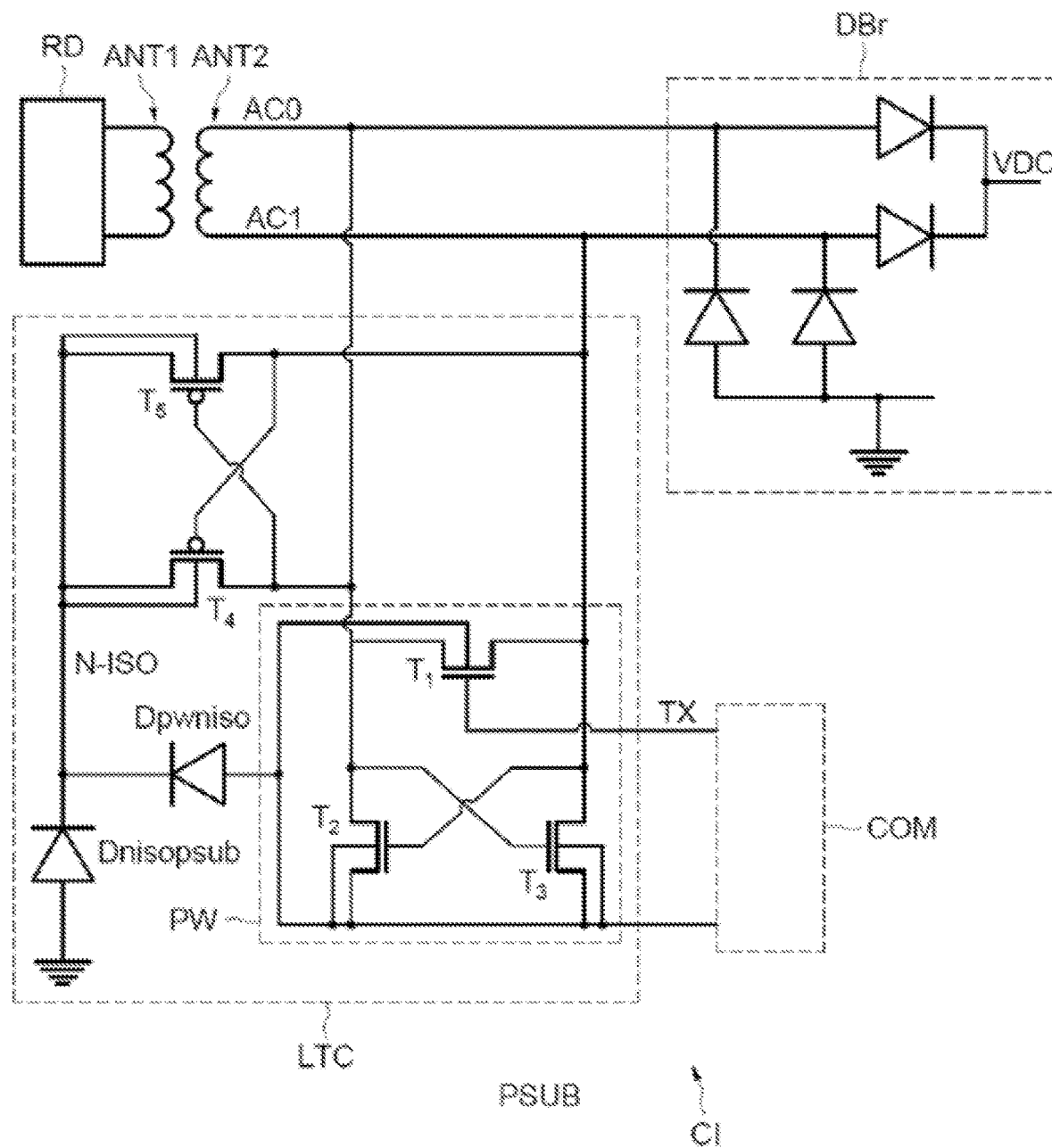
FIG. 1 shows a conventional electronic circuit comprising a diode bridge.

FIG. 1 shows a conventional electronic circuit CI suitable for a contactless application including a diode bridge DBr (typically a Graetz bridge) for delivering a direct current voltage VDC from the voltage present at the terminals AC0 and AC1 of the antenna ANT1 of the circuit, coupled to the antenna ANT2 of a reader RD.

In this application, the circuit CI includes a latch circuit LTC, conventionally having four transistors T2-T5, adapted to store a digital data element. A reset transistor T1 is also shown, and is controlled by a signal TX delivered by the circuit's processing means COM.

The latch LTC is formed in a box structure N-ISO, itself formed in a semiconductor substrate PSUB. The transistors T1-T3 are formed in a box structure PW, itself formed in the box structure N-ISO. The interfaces between the differently doped box structures form diodes Dpwniso and Dnisopsub.

A current flows in the antenna ANT1 in a direction representative of the data element stored in the latch LTC, so that this element can be read by the reader RD.

The diodes of the bridge DBr, based on polycrystalline silicon, also called polysilicon, are usually formed directly in the substrate PSUB, or in the box structure N-ISO, and this may introduce undesirable bipolar effects.

According to various embodiments, a method for manufacturing a plurality of diodes comprises simultaneously etching a semiconductor layer and a conductive layer to form a self-aligned diode region and simultaneously etching through first openings and second openings in a mask layer to form first implantation surfaces and second implantation surfaces, performing a first implantation of dopants having a second type of conductivity, of the P-type for example, in the semiconductor layer at the first implantation surfaces, the semiconductor layer being located on an insulating layer covering a semiconductor substrate and surmounted by projecting regions spaced apart from each other, so as to form a sequence of PN junctions forming the plurality of diodes in the semiconductor layer extending to the insulating layer at the edge of the projecting regions.

The projecting regions, which may advantageously be formed in combination with the formation of floating gates of floating-gate transistors of a non-volatile memory, thus serve as a hard mask for implantation, thus making it possible to clearly delimit the location of the PN junctions, and therefore the dimensions of the space charge areas, while using conventional implantation masks which can also be used for manufacturing non-volatile memories, without the need to provide strict alignment of these masks.

Furthermore, the implantation of the junctions up to the insulating layer makes it possible to suppress bipolar parasitic effects with the underlying substrate.

Additionally, a longitudinal dimension of the projecting regions may be advantageously self-aligned by virtue of the semiconductor layer and the conductive layer being simultaneously etched during formation of the self-aligned diode region. A lateral dimension of the projecting regions may also advantageously be controlled with high precision by simultaneously forming the first implantation surfaces and the second implantation surfaces. In this way, alignment limitations of the etch mask steps may be beneficially overcome. Further, a mask step may be removed when compared with conventional methods since the two sets of openings are formed at the same time which may advantageously facilitate compatibility with other process flows (e.g., NVM technology).

Although it is also possible to form implantations of the second type of conductivity, of the P-type for example, between each projecting region, so as to produce a series of diodes head to tail, it may be advantageous to alternate a P-type implantation with an N-type implantation, making it possible to form PN diodes which can readily be used in a Graetz bridge.

Thus, according to some embodiments, the method further comprises implanting a second implantation of dopants having a first type of conductivity, of the N-type for example, in the semiconductor layer, so that the first implantation of dopants, of the P-type for example, and the second implantation of dopants, of the N-type for example, define respectively, in the semiconductor layer, first areas having the second type of conductivity (of the P+ type for example) overdoped relative to the rest of the semiconductor layer, and second areas having the first type of conductivity (of the N+ type for example) overdoped relative to the rest of the semiconductor layer, a first area lying between two second areas and separated from these two second areas by two interleaved regions of the semiconductor layer located, respectively, under two neighboring projecting regions, each diode being formed at the junction between a first area and an interleaved region.

According to one embodiment, the first areas are of the P+ type of conductivity, forming the anodes of the diodes, the second areas are of the N+ type conductivity, forming the cathodes of the diodes together with the interleaved regions, and the method also comprises the forming of contacts on the first and second areas.

The insulating layer may be of the shallow trench type, and the semiconductor layer may be formed by a deposit of polysilicon on the insulating layer and implantation by dopants having the first type of conductivity.

Advantageously, the projecting regions comprise a layer of dielectric surmounted by a gate material.

According to one embodiment, the forming of the semiconductor layer is carried out simultaneously with the forming of floating gates of floating gate transistors, and the forming of the projecting regions is carried out simultaneously with the forming of control grids of the floating gate transistors.

According to various embodiments, an integrated circuit comprises, on top of an insulating layer surmounting a semiconductor substrate, a semiconductor layer having a first type of conductivity, projecting regions having equal lateral and longitudinal dimensions and being spaced apart from each other on the semiconductor layer, the longitudinal dimensions being the same as corresponding dimension of the underlying semiconductor layer, and a sequence of PN junctions forming diodes, extending in the semiconductor layer to insulating layer at the edge of the projecting regions.

According to some embodiments, the integrated circuit comprises, in the semiconductor layer, first areas having a second type of conductivity, overdoped relative to the rest of the semiconductor layer, and second areas having the first type of conductivity, overdoped relative to the rest of the semiconductor layer, a first area lying between two second areas and separated from these two second areas by two interleaved regions of the semiconductor layer located, respectively, under two neighboring projecting regions, each diode being formed at the junction between a first area and an interleaved region forming a diode.

According to one embodiment, the first areas are of the P+ type of conductivity, forming the anodes of the diodes, the second areas are of the N+ type of conductivity, forming the cathodes of the diodes together with the interleaved regions, and the first and second areas also comprise contacts on their surfaces.

The semiconductor layer may be a layer of polysilicon.

The projecting regions may comprise a layer of dielectric surmounted by a gate material.

Advantageously, some of the diodes form a current bridge rectifier of the Graetz bridge type.

According to one embodiment, wherein the integrated circuit further comprises floating gate transistors each comprising a floating gate and a control gate, the semiconductor layer is located at the same level as the floating gates of the floating gate transistors, and the projecting regions are located at the same level as the control gates of the floating gate transistors.

The integrated circuit may also comprise a non-volatile memory comprising the floating-gate transistors.

In other words, the various embodiments described herein relate to diodes having well-defined lateral and longitudinal dimensions and being completely insulated from the substrate. Consequently, behavior of the diodes may advantageously be tightly controlled and no parasitic effect due to a PN junction between a doped region of the diode and the substrate may occur.

The various embodiments described herein may also beneficially be fully compatible with the technological constraints of the use and manufacture of non-volatile memories, particularly non-volatile memories comprising floating gate transistors and without adding additional masking steps. For example, methods of fabricating diodes as described may allow the diodes to be fabricated with an NVM array. Flexibility in location of the diodes may also be advantageously achieved such as locating the diodes in the interior rather than at the periphery.

For example, the proposed modes of embodiment enable the diodes to be formed without adding any steps, and notably without adding any masking steps which may be critical in respect of alignment, to manufacturing floating gate transistors.

Furthermore, the embodiments described herein may be optimized for the technological field, notably as regards to the control of the dopant diffusion areas.

Embodiments described herein may also advantageously make it possible to reduce the surface area occupied by the diodes. Due to alignment limitations of masking steps, manufacturing processes may have limitations for dimensions of projecting regions used as a hard mask when the projecting regions are defined using multiple masking steps. The following embodiment fabrication processes may enable smaller lateral dimensions for projecting regions which may advantageously reduce surface area usage and/or improve diode performance.

The following figures illustrate embodiments of a fabrication process to form a semiconductor device comprising a series of diodes. FIGS. 2-5, 6A, 6B, 7A, 7B, 8A, 8B, and 9A, 9B illustrate cross-sectional views of a semiconductor device during various stages of fabrication in accordance with embodiments of the invention during fabrication.

Figure 2:
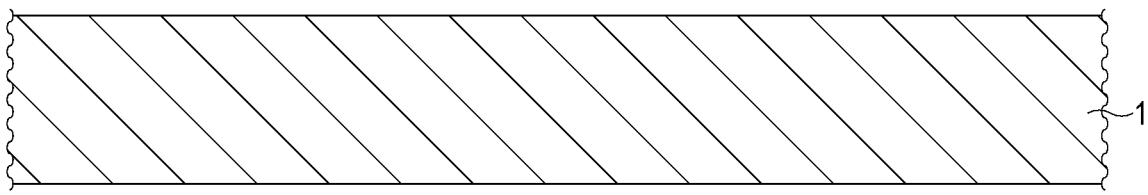
FIG. 2 illustrates a semiconductor device including a semiconductor substrate during fabrication in accordance with an embodiment of the invention.

FIG. 2 illustrates a semiconductor device including a semiconductor substrate during fabrication in accordance with an embodiment of the invention. Referring to FIG. 2, a semiconductor substrate 1 may be, with reference to FIG. 1, the substrate PSUB itself or a box structure formed in the substrate, for example the box structure N-ISO, again with reference to FIG. 1.

Figure 3:
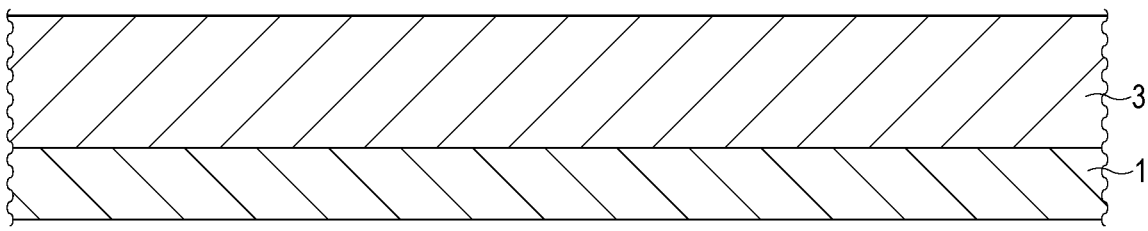
FIG. 3 illustrates the semiconductor device during fabrication and after forming an insulating layer over the semiconductor substrate in accordance with an embodiment of the invention.

FIG. 3 illustrates the semiconductor device during fabrication and after forming an insulating layer over the semiconductor substrate in accordance with an embodiment of the invention. Referring to FIG. 3, an insulating layer 3 is formed on the surface of the semiconductor substrate 1. The insulating layer 3 may be formed on a surface of the semiconductor substrate 1, for example, by a method for forming a shallow insulating trench.

Figure 4:
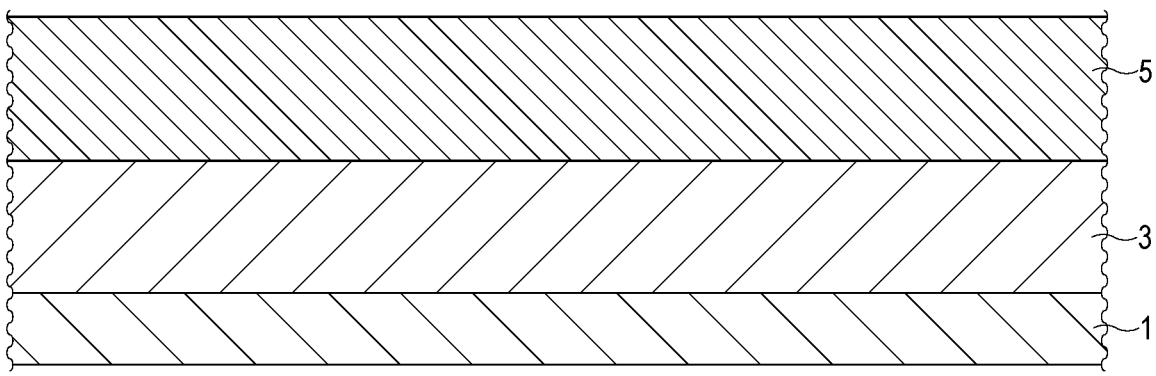
FIG. 4 illustrates the semiconductor device during fabrication and after forming a semiconductor layer over the insulating layer in accordance with an embodiment of the invention.

FIG. 4 illustrates the semiconductor device during fabrication and after forming a semiconductor layer over the insulating layer in accordance with an embodiment of the invention. Referring to FIG. 4, a semiconductor layer 5, for example a layer of polysilicon doped with a first type of conductivity, of the N-type for example, is formed on the insulating layer 3. In a customary method for manufacturing non-volatile memories, this step can be executed jointly with a step of forming polysilicon floating gates of floating-gate transistors.

Figure 5:
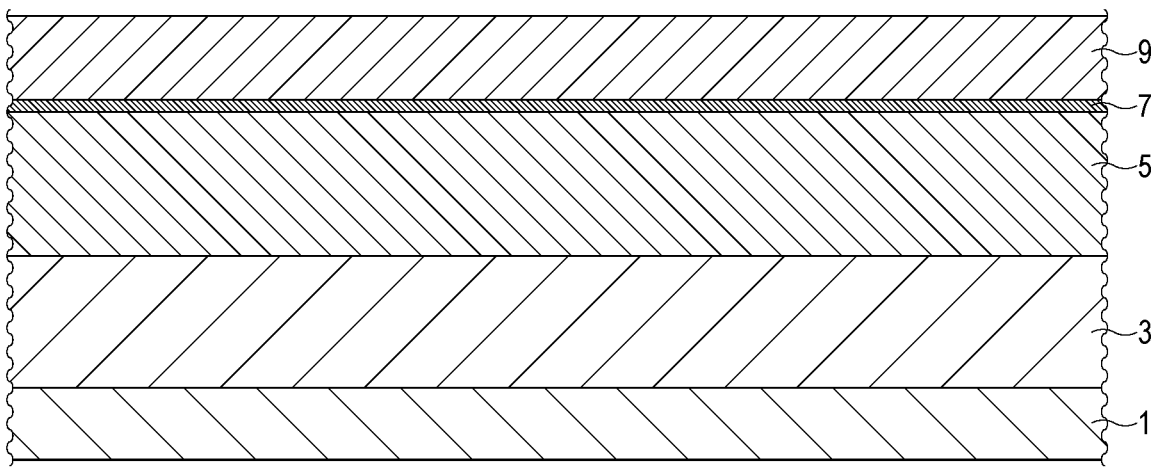
FIG. 5 illustrates the semiconductor device during fabrication and after forming a dielectric layer and a conductive layer over the semiconductor layer in accordance with an embodiment of the invention.

FIG. 5 illustrates the semiconductor device during fabrication and after forming a dielectric layer and a conductive layer over the semiconductor layer in accordance with an embodiment of the invention. Referring to FIG. 5, a layer of dielectric layer 7 is formed on the surface of the semiconductor layer 5, and a conductive layer 9 is formed over the layer of dielectric layer 7. The conductive layer 9 may be a semiconductor layer such as a layer of polysilicon, for example in accordance with the customary method for manufacturing non-volatile memories during which control gates of the floating-gate transistors are formed, usually comprising a layer of dielectric surmounted by a layer of polysilicon.

The control gates are, for example, formed in strips extending in a direction orthogonal to the section plane of FIG. 5. The control gates may also be formed from any other gate material, such as a metal. Thus, the conductive layer 9 may be replaced with a metallic layer in alternative embodiments. Additionally, structures known as "dummies" may be added to the functional structures, in order to avoid breaks in periodicity, for example, which may be harmful in some steps of the manufacture of integrated circuits. The dummies do not usually have any supplementary function.

Figure 6A:
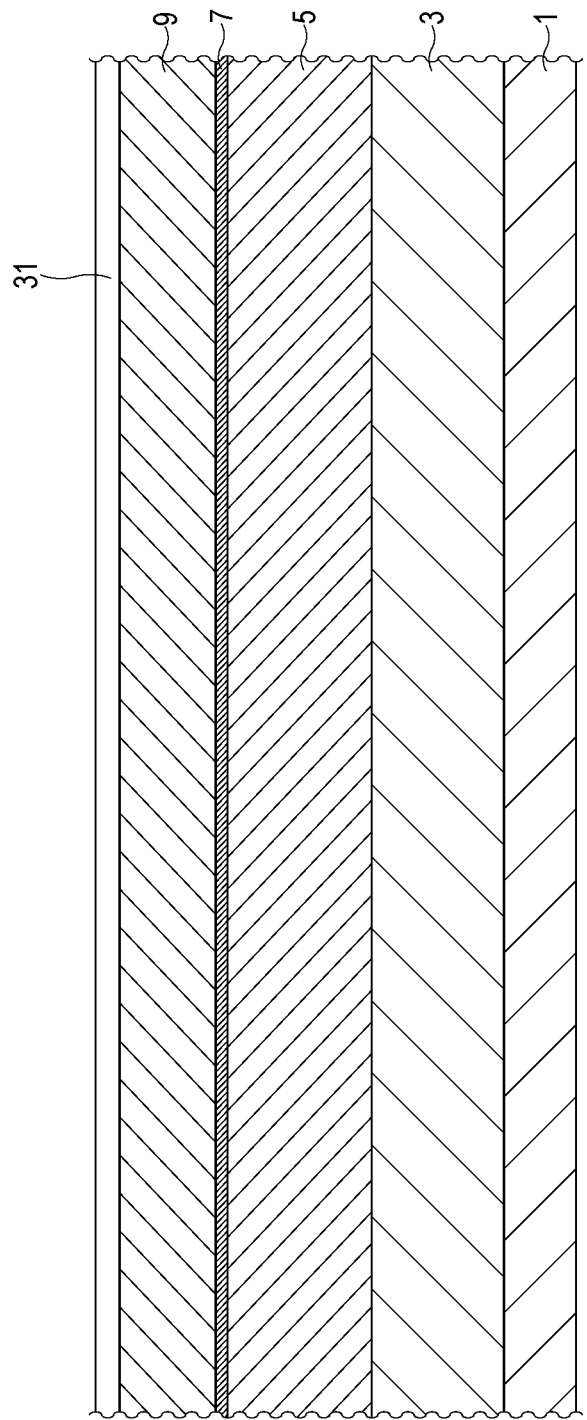

FIGS. 6A and 6B illustrate the semiconductor device during fabrication and after etching the stack in accordance with an embodiment of the invention, wherein FIG. 6A illustrates a cross sectional view of the semiconductor device and FIG. 6B illustrates a top view of the semiconductor device.

Referring to FIGS. 6A and 6B, a first etching mask layer 31 is deposited over the conductive layer 9. Using a process common to the floating gate process, the conductive layer 9, the dielectric layer 7, and the semiconductor layer 5 are patterned. This etching is common to the non-volatile floating gate etch and therefore does not require an additional mask. In particular, an island (i.e. a self-aligned diode region 35) comprising the semiconductor layer 5 and the conductive layer 9 is formed on the insulating layer 3 as also illustrated in the top view of FIG. 6B.

The self-aligned diode region 35 comprises a longitudinal dimension $L_1$ which is advantageously equal for both the semiconductor layer 5 and the conductive layer 9. Such self-alignment may provide the benefit of precisely defining the longitudinal dimension of diodes formed in the self-aligned diode region 35. In contrast, conventional methods may require an additional masking step and may have larger, more varied longitudinal dimensions that may be different between semiconductor layers and conductive layers. Additionally, the self-aligned diode region 35 may have any suitable width and may extend past the boundaries of the feature as shown.

FIGS. 7A and 7B illustrate the semiconductor device during fabrication and after etching the conductive layer and the dielectric layer to form projecting regions in accordance with an embodiment of the invention, wherein FIG. 7A illustrates a cross sectional view of the semiconductor device and FIG. 7B illustrates a top view of the semiconductor device.

Referring to FIGS. 7A and 7B, the conductive layer 9 is patterned to form the projecting regions 51. Specifically, a plurality of openings are simultaneously formed in a second etching mask layer 32. The plurality of openings include one or more first openings 6 and also one or more second openings 8. Advantageously, the projecting regions 51 that separate the plurality of openings are formed in a single masking step immunizing the projecting region width $W_1$ of the projecting regions 51 from potential alignment errors.

Further, the first openings 6 and the second openings 8 may have a first opening width $W_2$ and a second opening width $W_3$ which are defined by the patterning process of the second etching mask layer 32 and may therefore also be advantageously immunized from potential alignment errors. The first opening width $W_2$ and the second opening width $W_3$ may be the same or different. It is also conceivable that the widths of individual first openings may different from one another. Similarly, the widths of individual second openings may also be different from one another.

The projecting regions 51 may advantageously be dummy control gates specified in the context of a method of manufacturing floating-gate transistors. The projecting regions 51 may be formed by etching the conductive layer 9 and the dielectric layer 7 through the first openings 6 and second openings 8. The etching process includes more than one etching step in one embodiment. Each of the projecting regions 51 includes two projecting region edges 53. The projecting region edges 53 define the width $W_1$ of the projecting regions 51.

The projecting regions 51 are used as a hard mask for forming implantations of dopants in the semiconductor layer 5 as shown in FIGS. 8A, 8B, 9A, and 9B.

FIGS. 8A and 8B illustrate the semiconductor device during fabrication and after forming a first implant mask layer in accordance with an embodiment of the invention, wherein FIG. 8A illustrates a cross-sectional view of the semiconductor device and FIG. 8B illustrates a top view of the semiconductor device.

Referring to FIGS. 8A and 8B, a first implant mask layer 33 is formed and patterned to define first implantation surfaces 10. The first implant mask layer 33 may be subject to a certain amount of alignment error, depicted qualitatively by $W_4$. Advantageously, alignment error which may be introduced due to limitations of the implant masking process does not affect the first opening width $W_2$ which defines the lateral dimension of first implantation surfaces 10.

The first implantation surfaces 10 cover the parts of the semiconductor layer 5 located between two projecting regions 51, and may overflow on to a portion of the strips of projecting regions 51 as shown. For example, the alignment error $W_4$ may expose portions of the projecting regions 51. Thus, even if the first implantation surfaces 10 are poorly aligned relative to a specified implantation surface (that is to say, the surface of the semiconductor layer 5 between two projecting regions 51), the resulting implanted areas will be delimited precisely and regularly by the projecting region edges 53 of the projecting regions 51. Consequently, a first implantation 40 requires no supplementary critical masking step, particularly in a method including the forming of floating-gate transistors. This may permit a good degree of control of the implantation surfaces, and consequently the lateral distribution of dopants in the semiconductor layer 5.

The first implantation 40 is performed to dope the first implantation surfaces 10 with first dopants of a second type of conductivity, shown schematically in FIG. 8B. The second conductivity type is p-type in one embodiment, as illustrated. Alternatively, the second conductivity type may also be n-type. The first dopant concentration in the semiconductor layer 5 may be high (p+) so as to be overdoped relative to a doping of the semiconductor layer 5 (which may have a first type of conductivity) at the first implantation surfaces 10. In cases where the first dopants are of opposite conductivity type compared with the semiconductor layer 5, the first implantation 40 may be a counterdoping process.

Figure 9A:
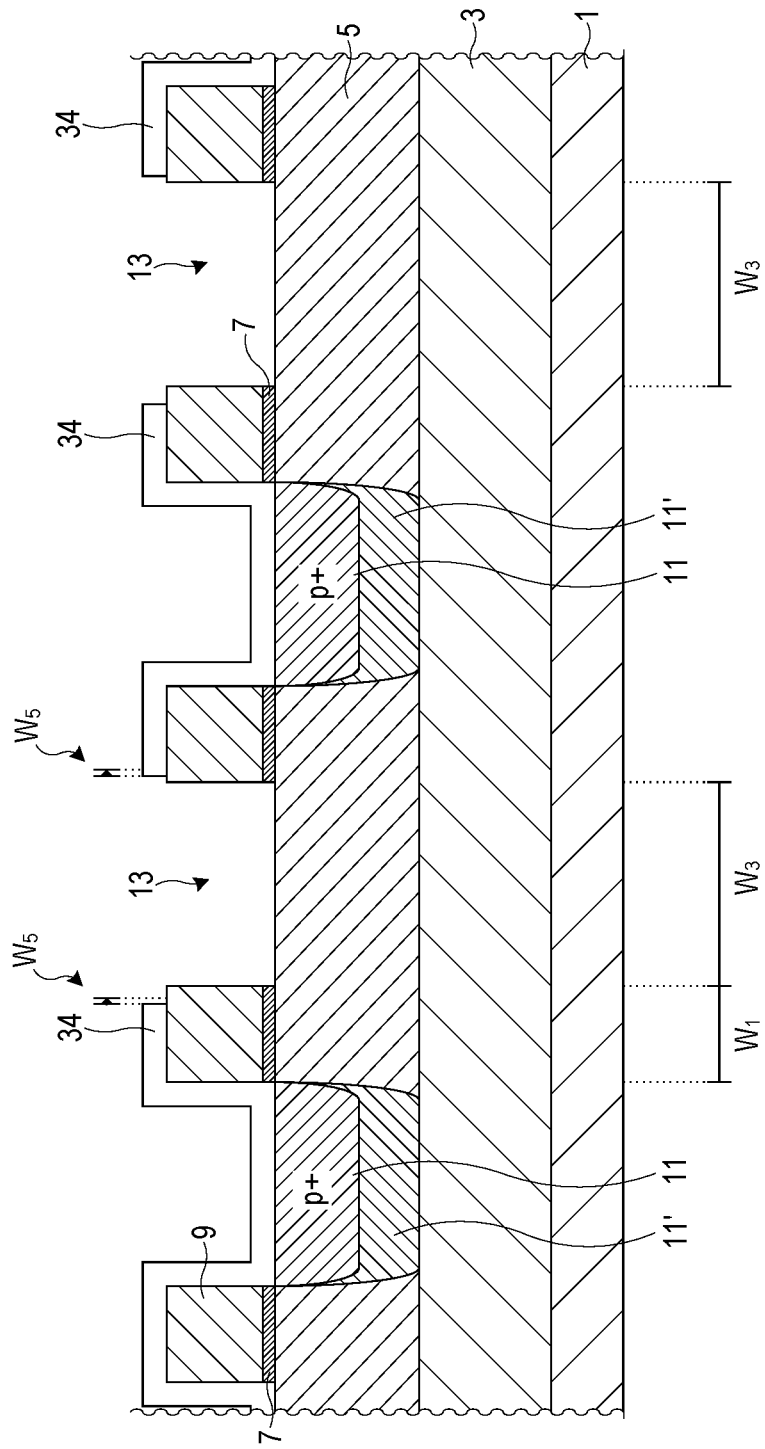

FIGS. 9A and 9B illustrate the semiconductor device during fabrication and after forming a second implant mask layer in accordance with an embodiment of the invention, wherein FIG. 9A illustrates a cross-sectional view of the semiconductor device and FIG. 9B illustrates a top view of the semiconductor device.

Referring to FIGS. 9A and 9B, a second implant mask layer 34 is formed and patterned to define second implantation surfaces 13. The second implant mask layer 34 may also be subject to a certain amount of alignment error, depicted qualitatively by $W_5$. Similar to the first implantation, advantageously, alignment error which may be introduced due to limitations of the implant masking process does not affect the second opening width $W_3$ which defines the lateral dimension of second implantation surfaces 13.

First implanted regions 11-11' have been formed below the first implantation surfaces 10 by the first implantation 40. The first implanted regions 11-11' comprise first strongly doped regions 11 extending from the first implantation surfaces 10. The first implanted regions 11-11' also comprise first deeper, less strongly doped regions 11' as a result of dopant diffusion. The first deeper, less strongly doped regions 11' extend to the insulating layer 3 in one embodiment. The first implanted regions 11-11' may be overdoped relative to the remaining semiconductor layer 5. For example, the concentration of dopants in the first implanted regions 11-11' may be higher by a factor of 100.

The second implantation surfaces 13 cover the parts of the semiconductor layer 5 located between two projecting regions 51, and may overflow on to a portion of the strips of projecting regions 51 as shown. For example, the alignment error $W_5$ may expose portions of the projecting regions 51. Thus, similar to the first implantation surfaces 10, even if the second implantation surfaces 13 are poorly aligned relative to a specified implantation surface, the resulting implanted areas will be delimited precisely and regularly by the projecting region edges 53 of the projecting regions 51. Consequently, a second implantation 43 also requires no supplementary critical masking step, particularly in a method including the forming of floating-gate transistors. This may permit a good degree of control of the implantation surfaces, and consequently the lateral distribution of dopants in the semiconductor layer 5.

The second implantation 43 is performed to dope the second implantation surfaces 13 with second dopants of the first type of conductivity, shown schematically in FIG. 9B. The first conductivity type is n-type in one embodiment, as illustrated. Alternatively, the first conductivity type may also be p-type. The second dopant concentration in the semiconductor layer 5 may be high (n+) so as to overdope the semiconductor layer 5 at the second implantation surfaces 13.

Figure 10A:
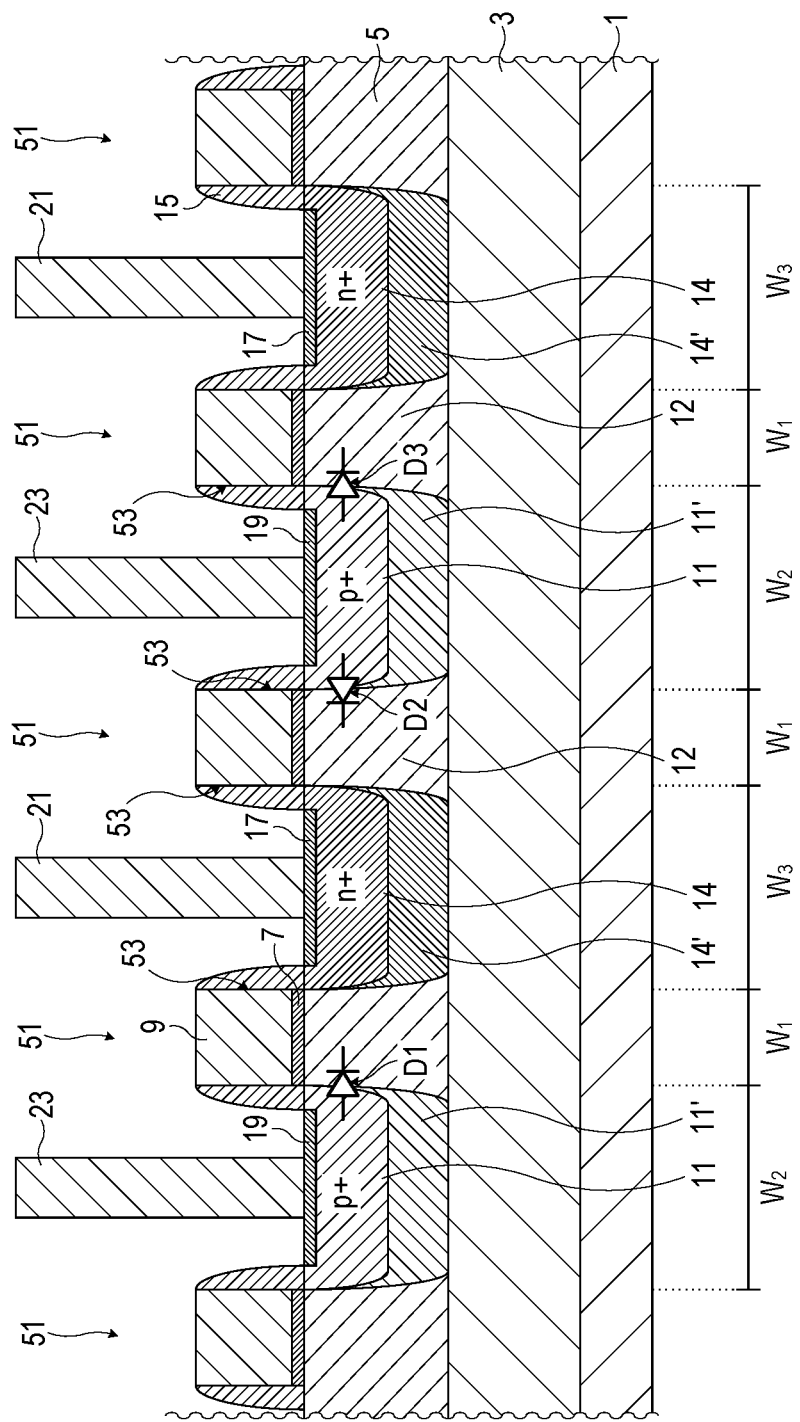

FIGS. 10A and 10B illustrate an example semiconductor device in accordance with an embodiment of the invention, wherein FIG. 10A shows a cross-sectional view of the semiconductor device and FIG. 10B shows a top view of the semiconductor device. The semiconductor device of FIGS. 10A and 10B may be formed using embodiment methods as illustrated and described herein, such as, for example, one or more of the steps of FIGS. 2-9B.

Referring to FIGS. 10A and 10B, second implanted regions 14-14' are formed below the second implantation surfaces 13 by the second implantation 43. The second implanted regions 14-14' comprise second strongly doped regions 14 extending from the second implantation surfaces 13. The second implanted regions 14-14' also comprise second deeper, less strongly doped regions 14' as a result of dopant diffusion. The second deeper, less strongly doped regions 14' extend to the insulating layer 3 in one embodiment.

Similar to the first implanted regions 11-11', the second implanted regions 14-14' may be overdoped relative to the remaining semiconductor layer 5. Specifically, the regions of the semiconductor layer 5 located under the projecting regions 51 are not implanted, and form interleaved regions 12 which may have a lower dopant concentration than both the first implanted regions 11-11' and the second implanted regions 14-14'.

The thickness of the semiconductor layer 5 and the depth of implantation of the dopants may be advantageously designed such that the first dopants of the first implantation 40 and/or the second dopants of the second implantation 43 are diffused throughout the thickness of the semiconductor layer 5, as far as the insulating layer 3. Thus, PN junctions between the first implanted regions 11-11' and the interleaved regions 12 extend to the insulating layer 3 and are located on the edges of the projecting region edges 53 in the semiconductor layer 5. Therefore, the diodes D1, D2, D3 may advantageously be completely insulated from the semiconductor substrate 1.

Since the dopant implantations are not isotropic, the term "projecting region edges" signifies a region adjacent, or close, to the geometric projection of the contour of the projecting regions in the semiconductor layer 5.

Thus, the first implanted regions 11-11' form anode regions and the second implanted regions 14-14' form, with the interleaved regions 12, cathode regions of three diodes D1, D2, D3. Accordingly, cathodes 17 and anodes 19 are formed, for example, after forming spacers 15 by saliciding areas of the semiconductor layer 5 not covered by the spacers 15. Cathode contacts 21 and anode contacts 23 are also formed to make electrical contact with the cathodes 17 and anodes 19 respectively. For example, the cathode contacts 21 and the anode contacts 23 may be metallic contacts.

By virtue of the self-aligned diode region 35, the cathodes 17 and the anodes 19 are precisely longitudinally defined by the longitudinal dimension $L_1$. Similarly, due to use of the projecting regions 51, formed in a single masking step, as hard masks during implantation, the cathodes 17 and the anodes 19 are precisely laterally defined by the lateral dimensions $W_1$, $W_2$, $W_3$. That is, the longitudinal and lateral dimensions of the diodes are defined with little or no alignment error.

Advantageously, the width $W_1$ of the projecting regions 51 may be reduced because of the increased precision. In various embodiments, the width $W_1$ is between about 0.5 μm and about 0.9 μm and is about 0.7 μm in one embodiment. The widths $W_2$ and $W_3$ may be similarly reduced. For example, the widths $W_1$, $W_2$, $W_3$ may be substantially equal and are all about 0.7 m in one embodiment. In another embodiment the widths $W_1$, $W_2$, $W_3$ are all about 0.5 µm.

The longitudinal dimension $L_1$ may be much larger than the widths $W_1$, $W_2$, $W_3$. In various embodiments, the longitudinal dimension $L_1$ is between about 150 µm and about 500 µm and is about 200 µm in one embodiment.

One region out of every two regions located between two strips of the projecting regions 51 is doped with the first type of conductivity, while the other is doped with the second type of conductivity. According, the three diodes D1, D2, D3 are formed. However, there may be more or fewer diodes depending on specific design details for a given application.

Additionally, at least one cathode region (i.e. second implanted regions 14-14') may be common to two different diodes, for example the diodes D1 and D2, and lies between two respective anode regions (i.e. first implanted regions 11-11'). Also, at least one anode region may be common to two different diodes, for example the diodes D2 and D3, and lies between two respective cathode regions.

This configuration with common electrodes may be advantageous for the construction of a diode bridge of the Graetz bridge type, having an anode node common to two diodes and a cathode node common to two diodes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, it is feasible for the second implantation 43 to be an implantation of dopants having the second type of conductivity, in a similar manner to the first implantation 40, forming a series of diodes head to tail between the implanted areas and the interleaved areas, the various cathodes being electrically connectable via contacts extending in a plane other than the planes of the attached FIGS. It is therefore intended that the appended claims encompass any such modifications or embodiments.

Example embodiments of the invention are summarized here. Other embodiments can also be understood from the entirety of the specification as well as the claims filed herein.

Example 1. A method of making a semiconductor device, the method including: simultaneously etching a semiconductor layer and a conductive layer to form a self-aligned diode region disposed on an insulating layer, the semiconductor layer having a first conductivity type; etching through first openings of a mask layer to form first implantation surfaces on the semiconductor layer and to form a plurality of projecting regions including conductive material of the conductive layer over the semiconductor layer; and using the plurality of projecting regions as a part of a first implantation mask, performing a first implantation of dopants having a second conductivity type into the semiconductor layer, to form a sequence of PN junctions forming diodes in the semiconductor layer, the diodes vertically extending from an upper surface of the semiconductor layer to the insulating layer.

Example 2. The method according to example 1, where the semiconductor layer is polysilicon.

Example 3. The method according to one of examples 1 or 2, where the conductive layer is polysilicon.

Example 4. The method according to one of examples 1 to 3, where a width of the first openings is between about 0.5 µm and about 0.9 µm.

Example 5. The method according to one of examples 1 to 4, further including: etching through second openings of the mask layer to form second implantation surfaces on the semiconductor layer, where etching through the second openings is performed concurrently with etching through the first openings; and using the plurality of projecting regions as part of a second implantation mask, performing a second implantation of dopants having the first conductivity type into the semiconductor layer so that each diode includes a heavily doped region of the first conductivity type adjacent to a lightly doped region of the first conductivity type adjacent to a doped region of the second conductivity type.

Example 6. The method according to one of examples 1 to 5, where a width of each of the plurality of projecting regions is between about 0.5 µm and about 0.9 µm.

Example 7. A method of making an integrated circuit, the method including: forming an insulating layer over a surface of a semiconductor substrate, the insulating layer including an active region at a first location of the semiconductor substrate; forming a semiconductor layer having a first conductivity type and overlying the insulating layer; forming a gate dielectric layer over the semiconductor layer; forming a conductive layer over the gate dielectric layer; simultaneously patterning the semiconductor layer, the gate dielectric layer, and the conductive layer to form a self-aligned diode region on the insulating layer at a second location of the semiconductor substrate; patterning the conductive layer to form a control gate overlying the floating gate at the first location and to form projecting regions overlying the semiconductor layer at the second location; and using the plurality of projecting regions as a hard mask, implanting dopants of a second conductivity type into first areas of the semiconductor layer so that interleaved regions beneath the plurality of projecting regions remain doped with the first conductivity type to form a sequence of PN junctions forming diodes in the semiconductor layer, the diodes vertically extending from an upper surface of the semiconductor layer to the insulating layer.

Example 8. The method according to example 7, where the semiconductor layer is polysilicon.

Example 9. The method according to one of examples 7 or 8, where the conductive layer is polysilicon.

Example 10. The method according to one of examples 7 to 9, where each distance separating adjacent projecting regions of the plurality of projecting regions is between about 0.5 µm and about 0.9 µm.

Example 11. The method according to one of examples 7 to 10, further including: using the plurality of projecting regions as a hard mask, implanting dopants of the first conductivity type into second areas of the semiconductor layer, the second areas of the semiconductor layer being more heavily doped than the interleaved regions.

Example 12. The method according to one of examples 7 to 11, where patterning the conductive layer to form the plurality of projecting regions includes: simultaneously forming first openings and second openings in a mask layer, the first openings directly overlying the first areas, and the second openings directly overlying the second areas.

Example 13. An integrated circuit including: a semiconductor substrate; an insulating layer overlying the semiconductor substrate; a semiconductor layer of a first conductivity type overlying the insulating layer, the semiconductor layer including a longitudinal length; a plurality of projecting regions that are spaced apart from each other overlying the semiconductor layer, each of the plurality of projecting regions including a longitudinal length equal to the longitudinal length of the semiconductor layer; and a sequence of PN junctions in the semiconductor layer, each PN junction located at an edge of an associated projecting region and vertically extending from an upper surface of the semiconductor layer to the insulating layer.

Example 14. The integrated circuit according to example 13, where the semiconductor layer is polysilicon.

Example 15. The integrated circuit according to one of examples 13 or 14, where each of the plurality of projecting regions is polysilicon.

Example 16. The integrated circuit according to one of examples 13 to 15, further including: a plurality of diodes, each including a PN junction of the sequence of PN junctions and a heavily doped region of the first conductivity type adjacent to a lightly doped region of the first conductivity type adjacent to a doped region of a second conductivity type.

Example 17. The integrated circuit according to one of examples 13 to 16. where a lateral width of each of the projecting regions is substantially equal and between about 0.5 μm and about 0.9 μm.

Example 18. The integrated circuit according to one of examples 13 to 17, where each distance separating adjacent projecting regions of the plurality of projecting regions is between about 0.5 μm and about 0.9 μm.

Example 19. The integrated circuit according to one of examples 13 to 18, further including: a plurality of diodes connected as a rectifier, each of the plurality of diodes including a PN junction of the sequence of PN junctions.

Example 20. The integrated circuit according to one of examples 13 to 19, where the rectifier includes a Graetz bridge.

What is claimed is:

1. A method of making a semiconductor device, the method comprising:
   simultaneously etching a semiconductor layer and a conductive layer to form a self-aligned diode region disposed on an insulating layer, the semiconductor layer having a first conductivity type;
   etching through first openings of a mask layer to form first implantation surfaces on the semiconductor layer and to form a plurality of projecting regions comprising conductive material of the conductive layer over the semiconductor layer; and
   using the plurality of projecting regions as a part of a first implantation mask, performing a first implantation of dopants having a second conductivity type into the semiconductor layer, to form a sequence of PN junctions forming diodes in the semiconductor layer, the diodes vertically extending from an upper surface of the semiconductor layer to the insulating layer.

2. The method according to claim 1, wherein the semiconductor layer is polysilicon.

3. The method according to claim 1, wherein the conductive layer is polysilicon.

4. The method according to claim 1, wherein a width of the first openings is between about 0.5 μm and about 0.9 μm.

5. The method according to claim 1, further comprising:
   etching through second openings of the mask layer to form second implantation surfaces on the semiconductor layer, wherein etching through the second openings is performed concurrently with etching through the first openings; and
   using the plurality of projecting regions as part of a second implantation mask, performing a second implantation of dopants having the first conductivity type into the semiconductor layer so that each diode includes a heavily doped region of the first conductivity type adjacent to a lightly doped region of the first conductivity type adjacent to a doped region of the second conductivity type.

6. The method according to claim 5, wherein a width of each of the plurality of projecting regions is between about 0.5 μm and about 0.9 μm.

7. A method of making an integrated circuit, the method comprising:
   forming an insulating layer over a surface of a semiconductor substrate, the insulating layer comprising an active region at a first location of the semiconductor substrate;
   forming a semiconductor layer having a first conductivity type and overlying the insulating layer;
   forming a gate dielectric layer over the semiconductor layer;
   forming a conductive layer over the gate dielectric layer;
   simultaneously patterning the semiconductor layer, the gate dielectric layer, and the conductive layer to form a self-aligned diode region on the insulating layer at a second location of the semiconductor substrate;
   patterning the conductive layer to form a control gate overlying the active region at the first location and to form projecting regions overlying the semiconductor layer at the second location; and
   using the plurality of projecting regions as a hard mask, implanting dopants of a second conductivity type into first areas of the semiconductor layer so that interleaved regions beneath the plurality of projecting regions remain doped with the first conductivity type to form a sequence of PN junctions forming diodes in the semiconductor layer, the diodes vertically extending from an upper surface of the semiconductor layer to the insulating layer.

8. The method according to claim 7, wherein the semiconductor layer is polysilicon.

9. The method according to claim 7, wherein the conductive layer is polysilicon.

10. The method according to claim 7, wherein each distance separating adjacent projecting regions of the plurality of projecting regions is between about 0.5 μm and about 0.9 μm.

11. The method according to claim 7, further comprising:
    using the plurality of projecting regions as a hard mask, implanting dopants of the first conductivity type into second areas of the semiconductor layer, the second areas of the semiconductor layer being more heavily doped than the interleaved regions.

12. The method according to claim 11, wherein patterning the conductive layer to form the plurality of projecting regions comprises:
    simultaneously forming first openings and second openings in a mask layer, the first openings directly overlying the first areas, and the second openings directly overlying the second areas.

13. An integrated circuit comprising:
    a semiconductor substrate;
    an insulating layer overlying the semiconductor substrate;
    a semiconductor layer of a first conductivity type overlying the insulating layer, the semiconductor layer comprising a longitudinal length;
    a plurality of projecting regions that are spaced apart from each other overlying the semiconductor layer, each of the plurality of projecting regions comprising a longitudinal length equal to the longitudinal length of the semiconductor layer; and a sequence of PN junctions in the semiconductor layer, each PN junction located at an edge of an associated projecting region and vertically extending from an upper surface of the semiconductor layer to the insulating layer.

14. The integrated circuit according to claim 13, wherein the semiconductor layer is polysilicon.

15. The integrated circuit according to claim 13, wherein each of the plurality of projecting regions is polysilicon.

16. The integrated circuit according to claim 13, further comprising:
a plurality of diodes, each comprising a PN junction of the sequence of PN junctions and a heavily doped region of the first conductivity type adjacent to a lightly doped region of the first conductivity type adjacent to a doped region of a second conductivity type.

17. The integrated circuit according to claim 13, wherein a lateral width of each of the projecting regions is substantially equal and between about 0.5 μm and about 0.9 μm.

18. The integrated circuit according to claim 13, wherein each distance separating adjacent projecting regions of the plurality of projecting regions is between about 0.5 μm and about 0.9 μm.

19. The integrated circuit according to claim 13, further comprising:
a plurality of diodes connected as a rectifier, each of the plurality of diodes comprising a PN junction of the sequence of PN junctions.

20. The integrated circuit according to claim 19, wherein the rectifier comprises a Graetz bridge.

\* \* \* \* \*